United States Patent
Fossum et al.

(10) Patent No.: US 8,546,901 B2
(45) Date of Patent: Oct. 1, 2013

(54) HIGH SENSITIVITY IMAGE SENSORS INCLUDING A SINGLE ELECTRON FIELD EFFECT TRANSISTOR AND METHODS OF OPERATING THE SAME

(75) Inventors: Eric R. Fossum, Wolfeboro, NH (US); Dae-Kil Cha, Suncheon-si (KR); Young-Gu Jin, Hwaseong-si (KR); Yoon-Dong Park, Yongin-si (KR); Soo-Jung Hwang, Gunpo-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 142 days.

(21) Appl. No.: 12/662,327

(22) Filed: Apr. 12, 2010

(65) Prior Publication Data

US 2010/0320515 A1    Dec. 23, 2010

(30) Foreign Application Priority Data

Apr. 10, 2009 (KR) .................. 10-2009-0031396

(51) Int. Cl.
*H01L 31/101* (2006.01)
*H01L 31/062* (2012.01)
*H01L 31/113* (2006.01)

(52) U.S. Cl.
USPC .......... 257/462; 257/290; 257/E27.113; 257/E31.053; 257/E31.073; 257/E31.074; 257/E31.076; 257/E31.079; 257/E31.082; 257/E31.085; 257/E31.091; 257/E33.076

(58) Field of Classification Search
USPC ........... 257/290, 462, E27.113, E31.053, 257/257/E31.073, E31.074, E31.076, E31.079, 257/E31.082, E31.085, E31.091, E33.076
See application file for complete search history.

(56) References Cited

U.S. PATENT DOCUMENTS

| | | | | |
|---|---|---|---|---|
| 5,751,023 A * | 5/1998 | Aono | ............ | 257/138 |
| 6,100,567 A * | 8/2000 | Burr | ............ | 257/365 |
| 6,171,916 B1 * | 1/2001 | Sugawara et al. | ............ | 438/303 |
| 6,600,192 B1 * | 7/2003 | Sugawara et al. | ............ | 257/329 |
| 6,771,112 B1 * | 8/2004 | Ishikawa et al. | ............ | 327/427 |
| 6,876,019 B2 * | 4/2005 | Shinohara | ............ | 257/292 |
| 7,247,899 B2 * | 7/2007 | Kuwabara et al. | ............ | 257/293 |
| 7,442,974 B2 * | 10/2008 | Tay | ............ | 257/291 |
| 7,566,622 B2 * | 7/2009 | Amali | ............ | 438/270 |
| 7,576,388 B1 * | 8/2009 | Wilson et al. | ............ | 257/330 |
| 7,592,655 B2 * | 9/2009 | Ohkawa et al. | ............ | 257/292 |
| 7,642,566 B2 * | 1/2010 | Vora et al. | ............ | 257/134 |
| 7,671,391 B2 * | 3/2010 | Kawahito | ............ | 257/290 |
| 7,800,176 B2 * | 9/2010 | Werner | ............ | 257/341 |
| 7,804,155 B2 * | 9/2010 | Chi | ............ | 257/536 |
| 7,875,915 B2 * | 1/2011 | Roy et al. | ............ | 257/292 |
| 7,902,577 B2 * | 3/2011 | Kang et al. | ............ | 257/292 |
| 7,948,029 B2 * | 5/2011 | Bhalla et al. | ............ | 257/330 |
| 8,030,705 B2 * | 10/2011 | Jang | ............ | 257/335 |
| 8,093,633 B2 * | 1/2012 | Poenar et al. | ............ | 257/257 |

(Continued)

FOREIGN PATENT DOCUMENTS

| | | |
|---|---|---|
| JP | 2006-351729 | 12/2006 |
| JP | 2007-165736 | 6/2007 |

*Primary Examiner* — Ida M Soward
(74) *Attorney, Agent, or Firm* — Harness, Dickey & Pierce, P.L.C.

(57) ABSTRACT

A high sensitivity image sensor including a pixel, the pixel including a single electron field effect transistor (SEFET), the SEFET including a first conductive type well in a second conductive type substrate, second conductive type source and drain regions in the well and a first conductive type gate region in the well between the source and the drain regions.

18 Claims, 10 Drawing Sheets

(56) References Cited

U.S. PATENT DOCUMENTS

| | | | |
|---|---|---|---|
| 8,093,651 B2 * | 1/2012 | Bhalla et al. | 257/328 |
| 2002/0100915 A1 * | 8/2002 | Hynecek | 257/158 |
| 2006/0043520 A1 | 3/2006 | Jerdev et al. | 257/462 |
| 2008/0014687 A1 * | 1/2008 | Vora et al. | 438/186 |
| 2008/0272395 A1 * | 11/2008 | Banna | 257/190 |
| 2009/0011532 A1 * | 1/2009 | Shimotsusa et al. | 438/59 |
| 2009/0075435 A1 * | 3/2009 | Vora | 438/149 |
| 2009/0166728 A1 * | 7/2009 | Pan | 257/330 |
| 2009/0243019 A1 * | 10/2009 | Kawai | 257/440 |
| 2010/0032729 A1 * | 2/2010 | Hao et al. | 257/272 |
| 2010/0140675 A1 * | 6/2010 | Rhodes | 257/292 |
| 2010/0315128 A1 * | 12/2010 | Kapoor | 326/112 |

* cited by examiner

HIGH SENSITIVITY IMAGE SENSORS INCLUDING A SINGLE ELECTRON FIELD EFFECT TRANSISTOR AND METHODS OF OPERATING THE SAME

CROSS REFERENCE TO RELATED APPLICATION

This application claims priority under 35 U.S.C. §119 to Korean Patent Application No. 10-2009-0031396, filed on Apr. 10, 2009, in the Korean Intellectual Property Office (KIPO), the entire contents of which is incorporated herein in by reference.

BACKGROUND

1. Field

Example embodiments of the inventive concepts relate to high sensitivity image sensors, and more particularly, to high sensitivity image sensors that may be capable of sensing a single electron.

2. Description of the Related Art

An image sensor may transform photonic images into electric signals. Recent advances in computer and communication industries have led to strong demand for high performance image sensors in various consumer electronic devices including, for example, digital cameras, camcorders, PCS (Personal Communication System), game devices, security cameras, and medical micro cameras.

Widely-used CCD image sensors or CMOS image sensors may include a group of unit pixels which make up a unit picture element. Typically, a pixel may be made to a size of about 2 um. Although pixel size can be further reduced, it may be difficult to improve the performance of an image sensor when the size becomes less than about 1 um. This may be because of very narrow dynamic range, smaller full well capacity, and/or a Signal to Noise Ratio (SNR) drop to about 10-20:1. Further, conversion gain (efficiency of charge to voltage conversion) may be related to the capacitance of a photo detecting area. The more capacitance a photo detection area has, the less conversion gain it may have. When a device becomes small, relative capacitance may be increased and as a result the conversion gain may be decreased.

Accordingly, to reduce pixel size, it may be required to process signals with different structures and concepts from conventional image sensors.

SUMMARY

According to example embodiments of the inventive concepts, high sensitivity image sensors capable of sensing single electrons are provided.

According to example embodiments of the inventive concepts, a high sensitivity image sensor may include a pixel including a single electron field effect transistor (SEFET) formed in a first conductive type substrate of a first conductive type, wherein the SEFET includes a second conductive type first well of a second conductive type formed in the substrate, first conductive type source and drain regions of the first conductive type formed with a predetermined space apart each other in the first well, and a second conductive type gate region of the second conductive type formed in the first well between the source and the drain regions.

According to example embodiments of the inventive concepts, a high sensitivity image sensor may include a substrate, a first well in the substrate, source and drain regions in the first well and a gate region in the first well between the source and drain regions According to example embodiments of the inventive concepts, a high sensitivity image sensor may include a single electron field effect transistor (SEFET) which detects light and outputs a quantity of the detected light, a source follower transistor coupled to the SEFET and a selective transistor coupled to the SEFET, wherein a pixel includes the three transistors.

According to example embodiments of the inventive concepts, a high sensitivity image sensor may include a single electron field effect transistor (SEFET) configured to detect light and output a voltage based on a quantity of the detected light, a source follower transistor connected to the SEFET and a selective transistor connected to the SEFET.

According to example embodiments of the inventive concepts, an image sensing method may be provided, which may include taking incident light on an image sensor; controlling the image sensor to operate a single electron field effect transistor (SEFET) and a source follower transistor in a saturation region; and measuring output voltage from a source region of the SEFET connected to the source follower transistor, the image sensor including the SEFET including a first well of a second conductive type formed in the substrate, source region and a first conductive type drain region of a first conductive type formed with a predetermined space apart each other in the first well, and a gate region of the second conductive type formed in the first well between the source region and the drain region and the source follower transistor coupled to the SEFET.

According to example embodiments of the inventive concepts, an image sensing method may be provided, which may include receiving incident light onto an image sensor, the image sensor including a single electron field effect transistor (SEFET) connected to a source follower transistor, biasing the SEFET and the source follower transistor into a saturation region and measuring an output voltage of the SEFET.

BRIEF DESCRIPTION OF THE DRAWINGS

Example embodiments of the inventive concepts will be more clearly understood from the following brief description taken in conjunction with the accompanying drawings. FIGS. 1-13 represent non-limiting, example embodiments as described herein.

FIG. 1 is a plan view of a high sensitivity image sensor according to example embodiments of the inventive concepts;

FIG. 3 is a graph of potential as a function of depth illustrating potential along a line III-III' of FIG. 2A;

FIG. 4 is a graph of potential as a function of depth illustrating potential in a single electron field effect transistor according to example embodiments of the inventive concepts;

FIG. 5 is a graph of gate voltage (meV) as a function of a number of electrons illustrating voltage change with respect to the number of electrons stored in a gate region of a single electron field effect transistor according to example embodiments of the inventive concepts;

FIG. 6 is an equivalent circuit diagram illustrating a high sensitivity image sensor according to example embodiments of the inventive concepts;

FIG. 8 is a cross-sectional diagram illustrating a high sensitivity image sensor according to example embodiments of the inventive concepts;

FIG. 9 is a plan view of a high sensitivity image sensor according to example embodiments of the inventive concepts;

FIG. 10 is a cross-sectional view taken along a line X-X' of FIG. 9;

FIG. 11 is a cross-sectional view taken along a line XI-XI' of FIG. 9;

FIG. 12 is a cross-sectional view taken along a line XII-XII' of FIG. 10; and

FIG. 13 is a simplified circuit diagram illustrating an image sensor according to example embodiments of the inventive concepts.

Figure 1:
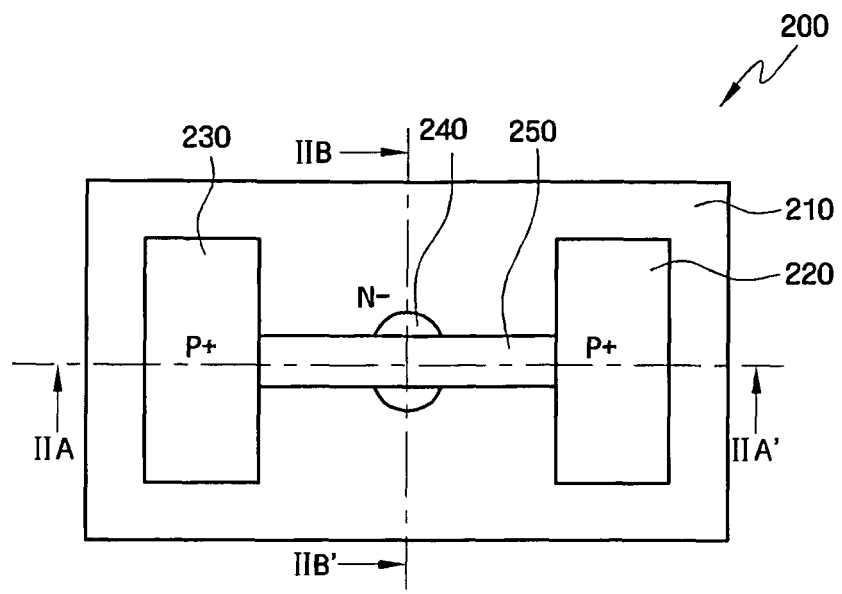

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments of the inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

An image sensor according to example embodiments of the inventive concepts may include CCDs (Charge Coupled Device) and CMOS (complementary metal-oxide-semiconductor) image sensors. Compared to CMOS image sensors, CCDs may have less noise and better image quality. CCDs may require high and/or increased voltage and expensive and/or increased process cost. CMOS image sensors may allow easy and/or improved operation and may be implemented by using various scanning methods. Product size reduction may be possible by integrating a signal processing circuit into a single chip and manufacturing cost may be reduced by using compatible CMOS process technology. Because of small and/or decreased power consumption it may be easy to apply to battery-operated products. Hereinafter, CMOS image sensors are used to illustrate an image sensor according to example embodiments of the inventive concepts. However, one having ordinary skill in the art will understand that example embodiments of the inventive concepts may be applied to and include CCDs.

Figure 2A:
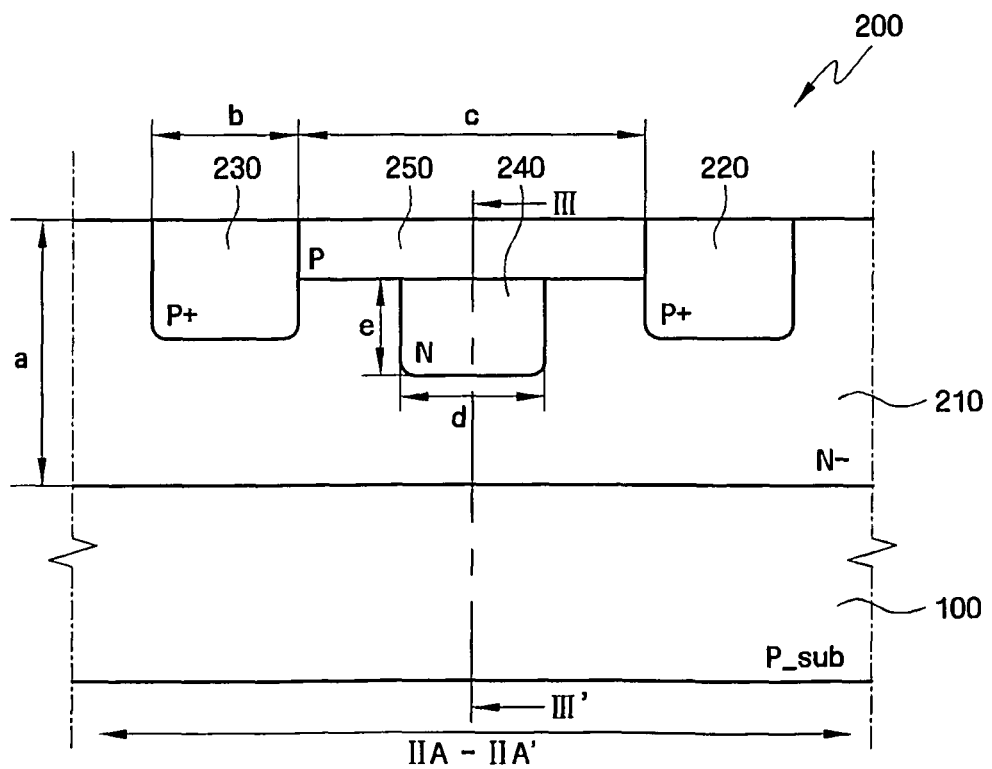
FIG. 2A is a cross-sectional view taken along a line IIA-IIA' of FIG. 1.
Figure 2B:
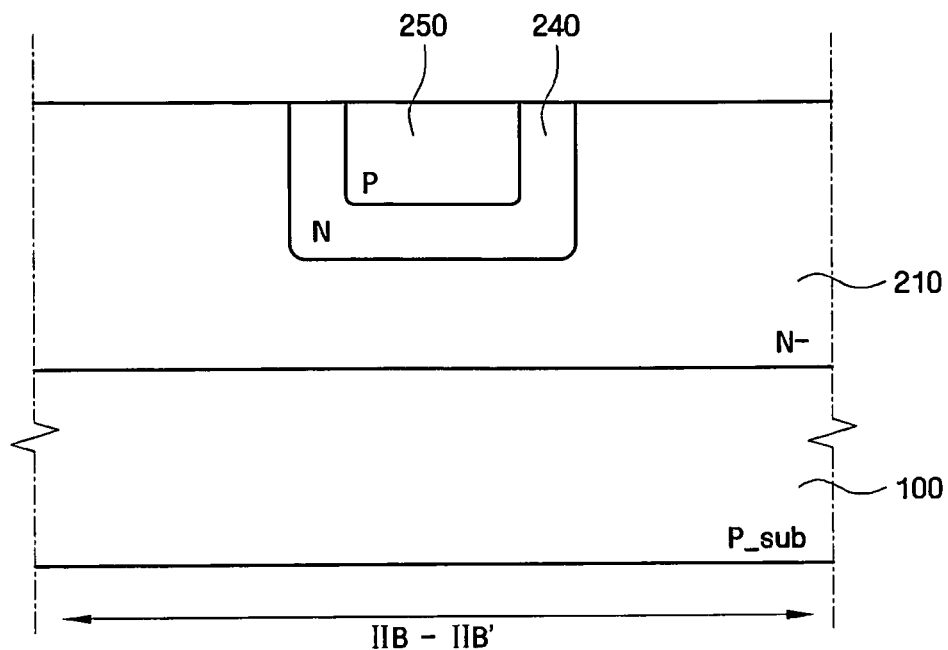
FIG. 2B is a cross-sectional view taken along a line IIB-IIB' of FIG. 1.

FIG. 1 is a plan view of a high sensitivity image sensor according to example embodiments of the inventive concepts. FIG. 2A is a cross-sectional view taken along a line IIA-IIA' of FIG. 1. FIG. 2B is a cross-sectional view taken along a line IIB-IIB' of FIG. 1. Referring to FIGS. 1-2B, a high sensitivity image sensor according to example embodiments of the inventive concepts may include a well 210 (e.g., an n-type well), a source region 220 and a drain region 230 on the well 210. A channel region 250 may be connected between the source region 220 and the drain region 230. A gate region 240 may be on the channel region 250 (e.g., on the bottom of the channel region 250) in a substrate 100 (e.g., a p-type substrate).

The well 210 may be in the substrate 100 and may be an impurity region doped with a lesser concentration of dopant than the gate region 240. For example, an n-type impurity concentration of the well 210 may be between, for example, about $1 \times 10^{14}$ and $1 \times 10^{17}$ atoms/cm$^3$. A depth "a" of the well 210, for example, may be about 200-500 nm; however, example embodiments of the inventive concepts are not so limited; the doping concentration and location may vary depending on fabrication process and design. The well 210 may be under the gate region 240 and may function as a photoelectric transformation region together with the gate region 240. Charges generated because of incident light may be accumulated.

The source region 220 and the drain region 230 may be, for example, p$^+$-type impurity regions. The source region 220 and the drain region 230 may be separated inside the well 210 and may be connected through the channel region 250. The impurity concentration of the source region 220 and the drain region 230, for example, may be between about $1 \times 10^{18}$ and $1 \times 10^{22}$ atoms/cm$^3$ and a width "b" may be about 30-100 nm. The width be may be a width of the source and/or drain regions 220 and 230. The source region 220 may be connected to the drain region 230 through the channel region 250. The channel region 250 may be, for example, a p-type impurity region and the impurity concentration, for example, may be between about $2 \times 10^{16}$ and $1 \times 10^{19}$ atoms/cm$^3$. A length "c" of the channel region which may be a width between the source region 220 and the drain region 230, for example, may be about 200-400 nm. A depth of the channel region, for example, may be about 100 nm.

The gate region 240 may be an n-type impurity region under the channel region 250. The gate region 240 may be isolated such that it does not connect to the source region 220 and the drain region 230. Because the gate region 240 may not connect to a contact, it may be understood to be floating (e.g., a floating gate) in the n-type well 210. The gate region 240 may be a region that accumulates charges generated from incident light and may function as a photoelectric transformation region. The impurity concentration of the gate region 240, for example, may be between about $1 \times 10^{16}$ and $1 \times 10^{19}$ atoms/cm$^3$. The gate region 240 may include an impurity concentration greater than that of the n-type well 210. The gate region 240 may be under the channel region 250 and a width "d", for example, may be about 80-200 nm and may be shorter than a length "c" of the channel region 250. A depth e of the gate region 240, for example, may be about 50-200 nm.

The n-type well 210, the source region 220, the drain region 230, the channel region 250 and the gate region 240 may be a junction transistor operated according to a quantity of incident light, the light incident on the gate region 240. The junction transistor may be referred to as a Single Electron Field Effect Transistor (SEFET) 200. The SEFET 200 may be a pixel of an image sensor and may function as a photoelectric transformation element and a sensing element. The SEFET 200 may simultaneously function as a photoelectric transformation element and a sensing element. The SEFET 200 may sense a single electron. Sensing may be performed with a small and/or decreased amount of light and conversion gain. A conversion gain (efficiency of converting charge to voltage) may be greater than about 1 meV/e.

In the SEFET 200 of a high sensitivity image sensor according to example embodiments of the inventive concepts, the total combined length of the source region 220, the channel region 250, and the gate region 240 may be less than about 1 um. A pixel smaller than about 1 um may be provided. Because the SEFET 200 may function as both a photoelectric transformation element and a sensing element, and because the size of gate region 240 may be small, capacitance may be decreased. High and/or improved conversion gain may be achieved.

Figure 3:
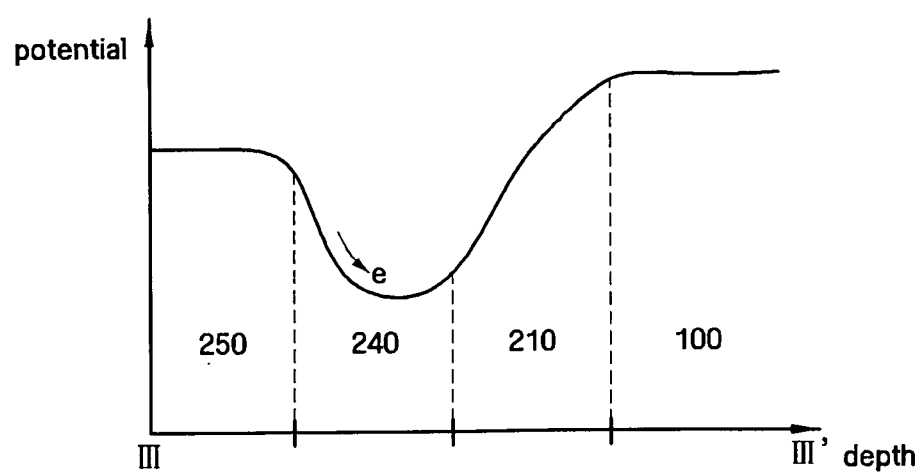

FIG. 3 is a graph of potential as a function of depth illustrating potential along a line III-III' of FIG. 2A. Referring to FIG. 3, the gate region 240 and the well 210 may be located in between the channel region 250 and the sub-substrate 100 in a potential well. Charges may be generated by light incident on the SEFET 200. Electrons may be locked in the potential well of the gate region 240 and the well 210. The gate region 240 and the well 210 under the gate region 240 illustrated in FIGS. 1-2B may function as a photoelectric transformation element.

Figure 4:
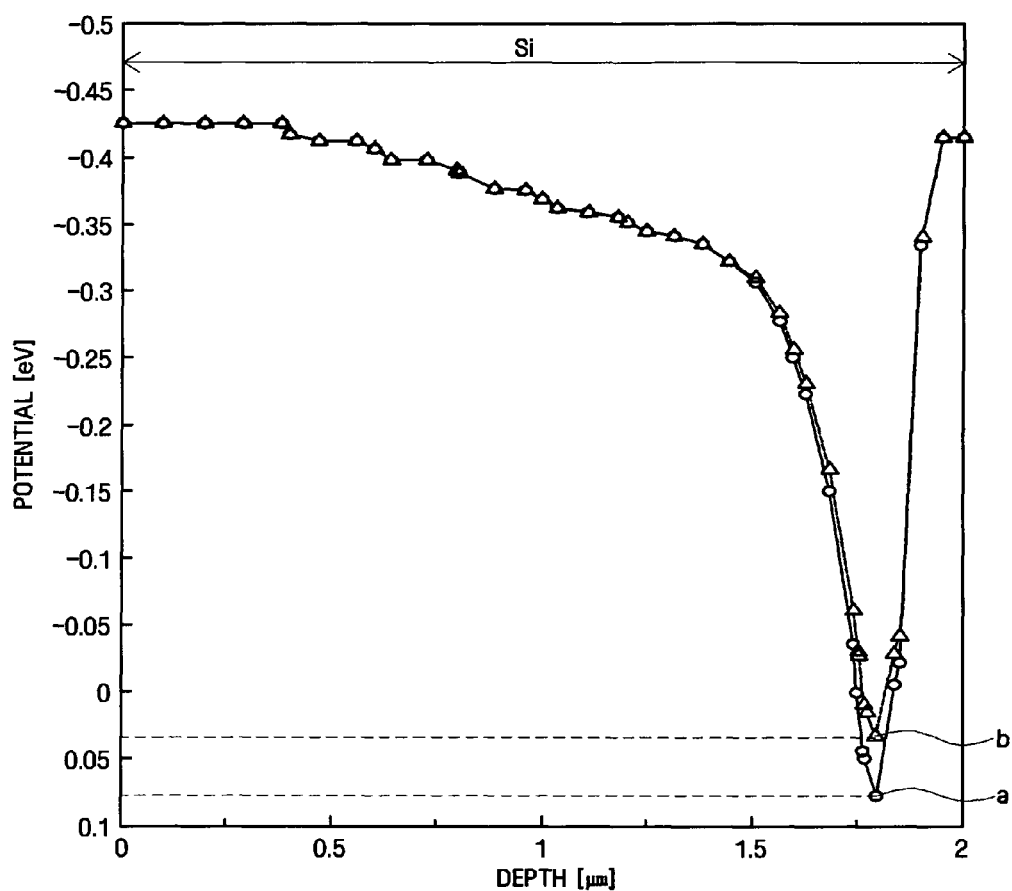

FIG. 4 is a graph of potential as a function of depth illustrating potential in a single electron field effect transistor of a high sensitivity image sensor according to example embodiments of the inventive concepts. The x-axis may represent distance from a bottom of a substrate to an upper region and a y-axis may represent corresponding potentials. Referring to FIG. 4, a potential graph with no electron stored in the gate region of the SEFET may be illustrated by "a" and "b" may illustrate a potential graph with 5 electrons stored in the gate region of the SEFET. Referring to FIG. 4, a voltage difference between "a" and "b" may be about 44 meV. Since 5 electrons may introduce about a 44 meV voltage difference, the conversion gain may be about 9 meV/e.

Figure 5:
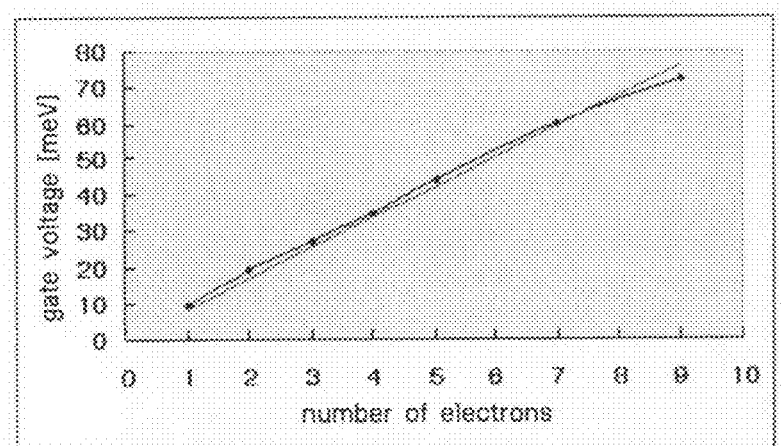

FIG. 5 is a graph of gate voltage (meV) as a function of a number of electrons illustrating voltage change with respect to the number of electrons stored in a gate region of a single electron field effect transistor of a high sensitivity image sensor according to example embodiments of the inventive concepts. Referring to FIG. 5, a voltage of about 9.5 meV may be observed when one electron is stored. When two electrons are stored, a voltage of about 19 meV may be observed. Because voltage changes based on a number of electrons, electron unit level sensing may be possible. In FIG. 5, since a voltage of about 9.5 meV may be observed when one electron is stored, conversion gain may be about 9.5 meV/e. In a high sensitivity image sensor according to example embodiments of the inventive concepts, conversion gain may be greater than 1 meV/e. Sensing may be performed with one electron and a high and/or improved sensitivity image sensor may be provided.

Figure 6:
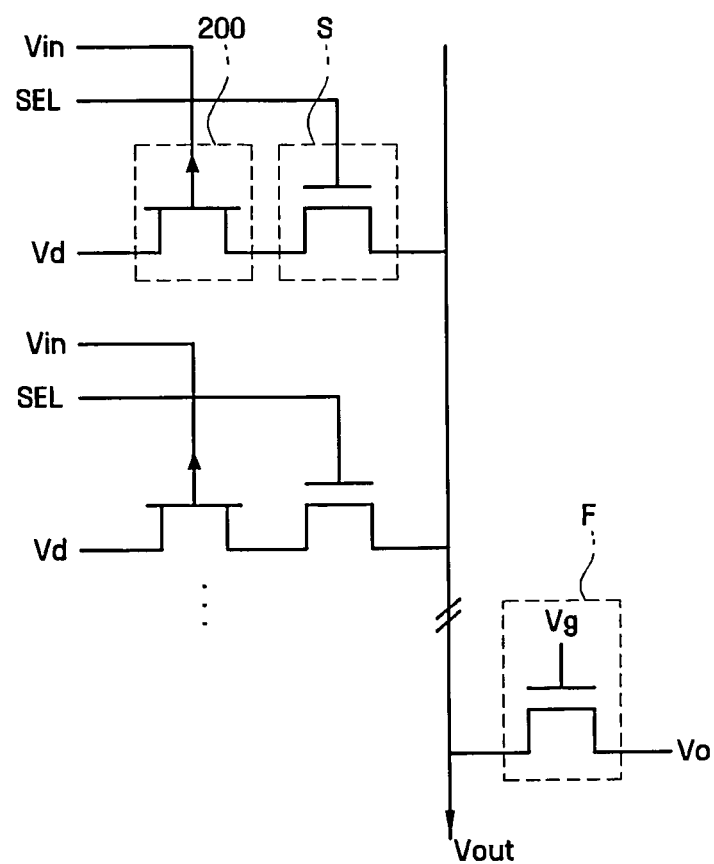

FIG. 6 is an equivalent circuit diagram illustrating a high sensitivity image sensor according to example embodiments of the inventive concepts. Referring to FIG. 6, a SEFET 200 and a selective transistor F may be coupled. The selective transistor S may be connected to a source follower transistor F. In a high sensitivity image sensor the SEFET 200, the selective transistor S and the source follower transistor F may be one pixel. The SEFET 200 may receive light and sense electrons generated by the light. A drain voltage Vd may be applied to a drain of the SEFET. An input voltage Vin may be generated on a gate of an SEFET by the generated electrons depending on the amount of light received. The selective transistor S may be turned on by a bias provided by a row selection line SEL. When the selective transistor S is turned on, the SEFET 200 and the source follower transistor F may be electrically connected. The source follower transistor F may be coupled to the SEFET 200 through the selective transistor S. An output voltage Vout may be input to a source, a voltage $V_o$ may be applied to a drain and a voltage Vg may be applied to the gate of the follower transistor F.

Figure 7A:
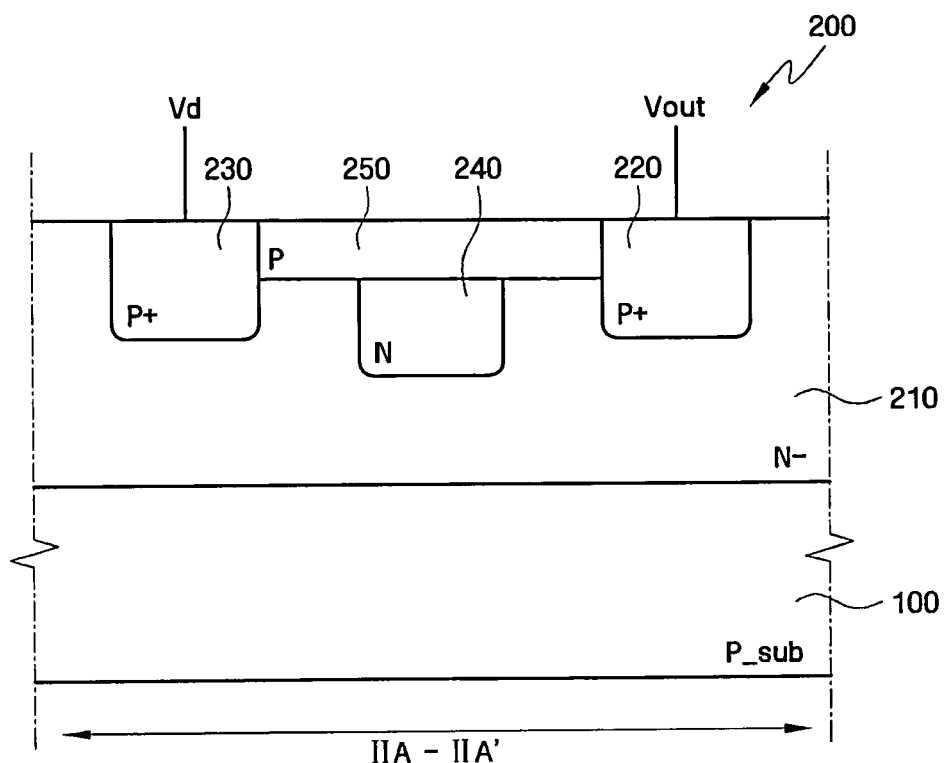
FIGS. 7A and 7B are diagrams illustrating sensing of a high sensitivity image sensor according to example embodiments of the inventive concepts.
Figure 7B:
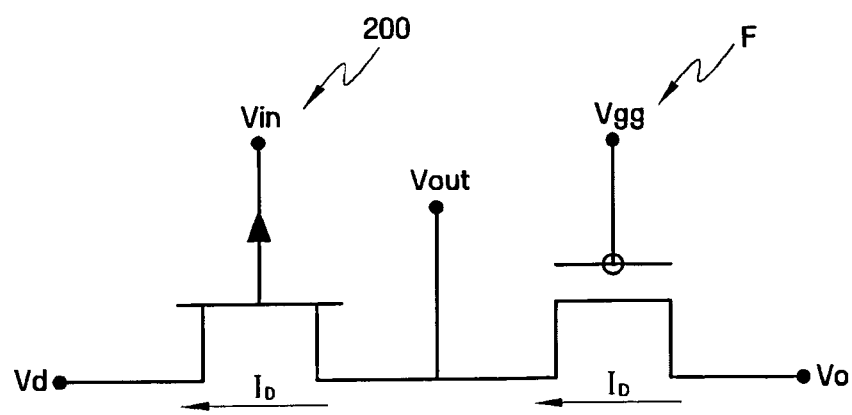

FIGS. 7A and 7B are diagrams illustrating sensing of a high sensitivity image sensor according to example embodiments of the inventive concepts. In a reset operation, a reset may remove electrons stored in a gate region 240 (e.g., generated according to photoelectric transformation). To remove all the electrons stored in the gate region 240, a voltage more than about 1 V may be applied to a substrate 100. Electrons may exit to the substrate 100. A voltage of −1 V may be applied to a source region 220 and a drain region 230. When −1 V is applied to the source region 220 and the drain region 230, electrons may exit to the substrate 100.

A photoelectric transformation operation may be described as follows. When photoelectric transformation occurs at the gate region 240, a voltage of about 0 V may be applied to the drain region 230, the source region 220, and the substrate 100, and/or the gate region 240 may be floated (e.g., isolated). Electrons generated in the gate region 240 and a well 210 under the gate region 240 may be collected at the gate region 240: Holes may exit to the substrate 100.

A sensing operation may be described as follows. When the source follower transistor F and the SEFET 200 are operated in a saturation region, each transistor may be controlled, for example, by the voltage between a gate and a source. An output voltage Vout, which may be linear to the input voltage Vin applied to the SEFET 200, may be produced at the source of the source follower transistor F which may be connected to the source region of SEFET 200. Because the current that flows between the source follower transistor F and the SEFET 200 may be identical, the relationship between input voltage and output voltage may be summarized as follows. At equation 1, $V_T$ is threshold voltage of the source follower transistor F, $V_P$ is threshold voltage of the SEFET 200 and, A and C are constants.

$$I_D = A(V_{gg} + V_T) = (V_P - V_{in} + V_{out}) \therefore V_{in} = V_{out} + C \quad \text{[Equation 1]}$$

According to equation 1, the output voltage Vout may be linear to the input voltage Vin. In a high sensitivity image sensor according to example embodiments of the inventive concepts, an SEFET may function as a photoelectric transformation element and/or a sensing element.

Figure 8:
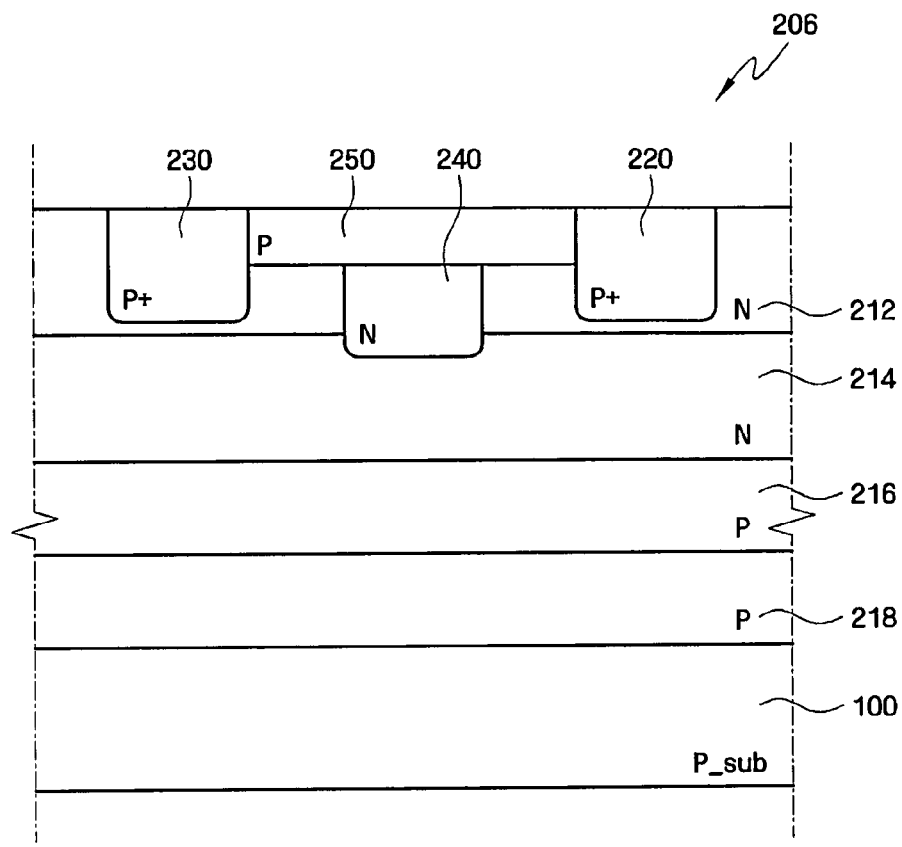

FIG. 8 is a cross-sectional diagram illustrating a high sensitivity image sensor including an SEFET 206 according to example embodiments of the inventive concepts. Referring to FIG. 8, a well may include two separate wells including a well 212 (e.g., an upper n-type well) and a well 214 (e.g., a lower n-type well). The impurity concentration of the well 212 may be greater than that of the well 214. In a lower region of the well 214, wells 216 and 218 (e.g., p-type wells) may be formed. Although sensor operations may be performed only with a substrate 100 (e.g., a p-type substrate), to improve performance further the wells 216 and 218 may be formed in a lower region of the well 214. An impurity concentration of the well 216 may be smaller than that of the well 218.

Figure 9:
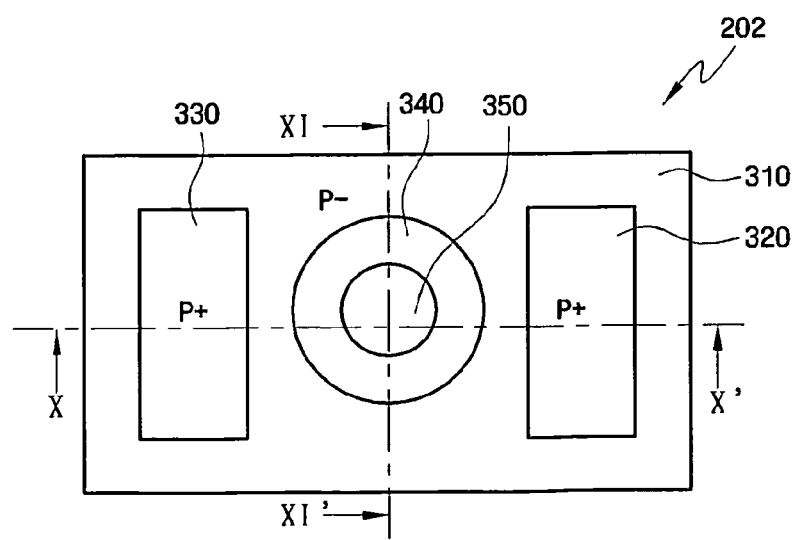
Figure 10:
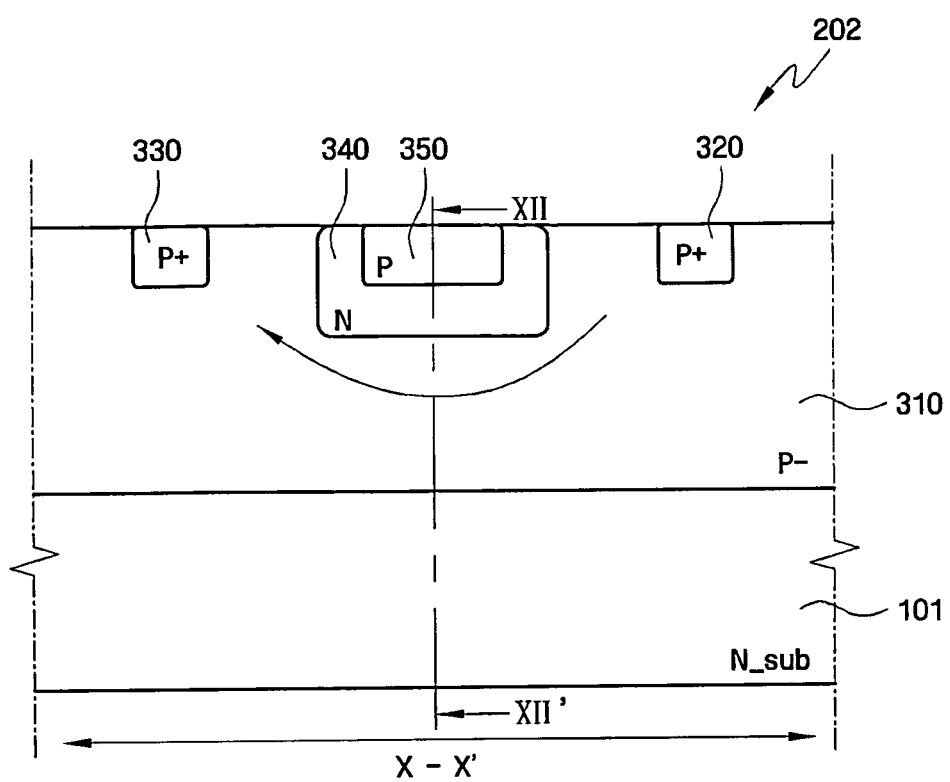
Figure 11:
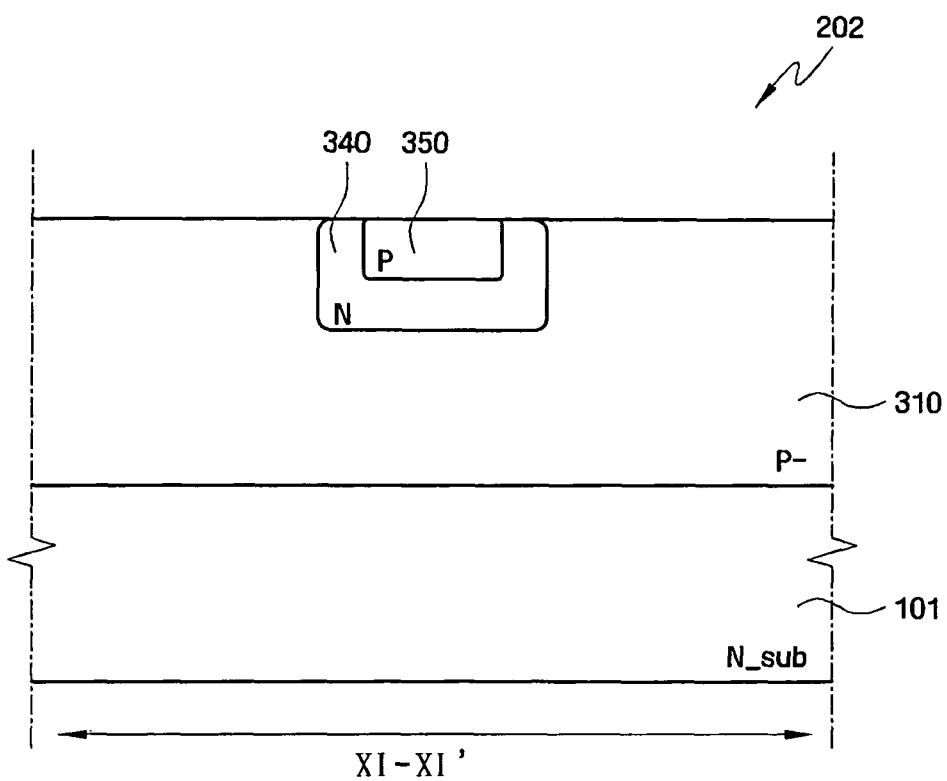

FIG. 9 is a plan view of a high sensitivity image sensor according to example embodiments of the inventive concepts. FIG. 10 is a cross-sectional view taken along a line X-X' of FIG. 9. FIG. 11 is a cross-sectional view taken along a line XI-XI' of FIG. 9. Referring to FIGS. 9-11, a SEFET 202 of a high sensitivity image sensor according to example embodiments of the inventive concepts may include a well 310 (e.g., a p-type well) on a substrate 100 (e.g., an n-type substrate). A source region 320 and a drain region 330 may be separated in the well 310. A gate region 340 may be floated in the well 310 between the source region 320 and the drain region 330. The source region 320 and the drain region 330 may be, for example, p-type impurity regions. The gate region 340 may be, for example, be an n-type impurity region. An impurity region 350 (e.g., a p-type impurity region) may be in the gate region 340, for example, encircled by the gate region 240.

In the SEFET 202 of a high sensitivity image sensor according to example embodiments of the inventive concepts, the well 310 under the gate region 340 may function as a channel region. The P-well region 310 may surround the gate region 340 and may become a channel region. An arrow shown in FIG. 10 may indicate an example of a channel between the source region 320 and the drain region 330. A high sensitivity image sensor according to example embodiments of the inventive concepts, for example a high sensitivity image sensor according to example embodiments illustrated in FIG. 8, may include an n-type well under the well 310 (e.g., p-type well. 310) and the well 310 may include multiple wells having different impurity concentrations.

Figure 12:
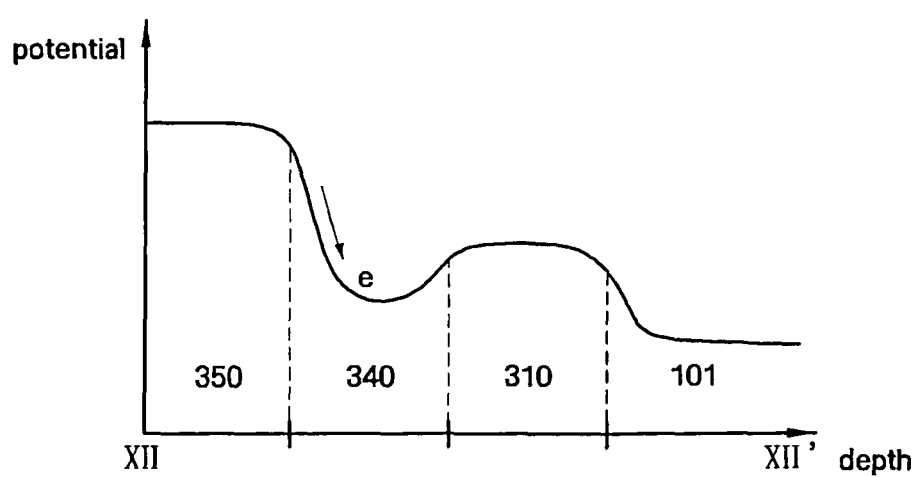

FIG. 12 is a cross-sectional view taken along a line XII-XII' of FIG. 10. Referring to FIG. 12, a potential well may be in the gate region 240 and electrons may be stored.

Figure 13:
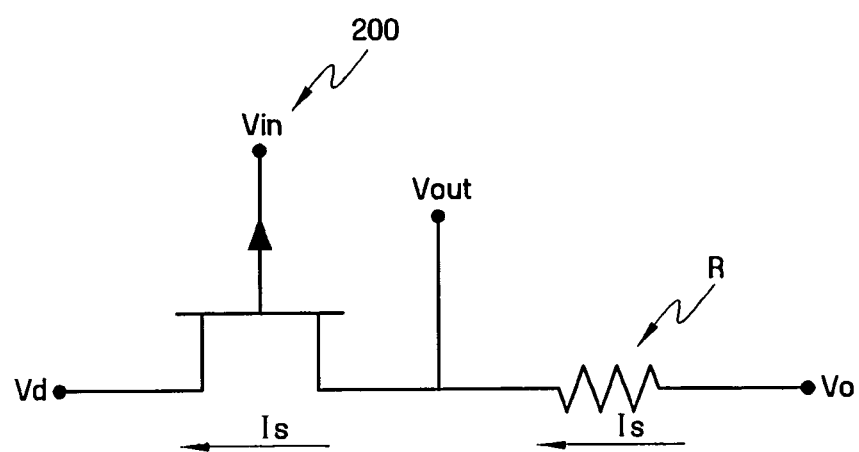

FIG. 13 is a simplified circuit diagram illustrating an image sensor according to example embodiments of the inventive concepts. Referring to FIG. 13, in a high sensitivity image sensor according to example embodiments, a source follower transistor may not be included and a source follower resistor R may be included. When the source follower resistor R is included, and a voltage $V_o$ (e.g., about 0V) is applied to one end of the resistor R, a relationship between input voltage and output voltage may be summarized as follows. At equation 2, g is a constant.

$$I_S = g(V_{in} - V_{out}) = V_{out}/R \therefore V_{in} = V_{out} \quad \text{[Equation 2]}$$

While example embodiments of the inventive concepts have been particularly shown and described, it will be understood by one of ordinary skill in the art that variations in form and detail may be made therein without departing from the spirit and scope of the claims. Therefore, it should be understood that the above example embodiments are not limitative, but illustrative in all aspects.

What is claimed is:
1. A high sensitivity image sensor, comprising:
a substrate;
a first well in the substrate, the first well being configured to be a photoelectric transformation region to generate charges by incident light, the first well including a first well region and a second well region, a concentration of impurities in the first well region being greater than a concentration of impurities in the second well region;

source and drain regions in the first well;

a gate region in the first well between the source and drain regions, the gate region being configured to accumulate the generated charges; and a channel region on the gate region in the substrate, the channel region being configured to connect the source and drain regions.

2. The high sensitivity image sensor of claim 1, wherein the gate region is configured to be a photo detecting region.

3. The high sensitivity image sensor of claim 1, wherein the first well, the gate region, the source region and the drain region are part of a single electron field effect transistor (SEFET) of a pixel, and the pixel includes a source follower resistor connected in series to the SEFET.

4. The high sensitivity image sensor of claim 1, wherein the gate region is configured to generate an input voltage in response to light incident onto the gate region, and the high sensitivity image sensor is configured to detect an output voltage from the source region.

5. The high sensitivity image sensor of claim 1, wherein the source and drain regions are spaced apart from each other in a first direction, the first direction is perpendicular to a second direction, the channel region includes a first width extending in the first direction that is wider than a first width of the gate region extending in the first direction, and the gate region includes a second width extending in the second direction that is wider than a second width of the channel region extending in the second direction.

6. The high sensitivity image senor of claim 1, wherein the first well, the gate region, the source region and the drain region are part of a single electron field effect transistor (SEFET), and the SEFET is connected to one of a source follower transistor and a source follower resistor.

7. A pixel of a high sensitivity image sensor, comprising: the SEFET of claim 6, wherein the SEFET is configured to detect light and output a voltage based on a quantity of the detected light, the SEFET is connected to the source follower transistor, and the pixel includes a selective transistor connected to the SEFET.

8. The high sensitivity image sensor of claim 1, wherein the substrate is of a first conductive type, the first well is of a second conductive type, the source and drain regions are of the first conductive type, the gate region is of the second conductive type, and the channel region is of the first conductive type.

9. The high sensitivity image sensor of claim 8, wherein the first well region and the second well region of the, first well are p-type.

10. The high sensitivity image sensor of claim 8, wherein the first conductive type is p-type, and the second conductive type is n-type.

11. The high sensitivity image sensor of claim 10, further comprising:

a second well of the first conductive type under the first well.

12. The high sensitivity image sensor of claim 11, wherein the second well includes a third well region and a fourth well region, and an impurity concentration of the third well region is less than an impurity concentration of the fourth well region.

13. A high sensitivity image sensor comprising:

a substrate, the substrate being of a first conductive type;

a first well in the substrate, the first well being of a second conductive type;

source and drain regions in the first well the source and drain regions being of the second conductive type;

a gate region in the first well between the source and drain regions, the gate region being of the first conductive type; and an impurity region in the gate region, the impurity region being of the second conductive type.

14. The high sensitivity image sensor of claim 13, wherein the first well surrounds the gate region below a surface of the substrate, and at least a part of the first well between the source and drain regions is a channel region.

15. The high sensitivity image sensor of claim 13, wherein the first conductive type is n-type, and the second conductive type is p-type.

16. The high sensitivity image sensor of claim 13, wherein the gate region encircles the impurity region.

17. A high sensitivity image sensor, comprising:

a substrate;

a first well in the substrate;

source and drain regions in the first well; and a gate region in the first well between the source and drain regions, wherein the first well, the gate region, the source region and the drain region are part of a single electron field effect transistor (SEFET) of a pixel, and the pixel includes a source follower transistor connected to the SEFET.

18. The high sensitivity image sensor of claim 17, comprising:

the pixel of claim 17; and a selective transistor connected to the SEFET.

* * * * *